(12) United States Patent
Woychik et al.

(10) Patent No.: US 9,780,042 B2
(45) Date of Patent: Oct. 3, 2017

(54) TUNABLE COMPOSITE INTERPOSER

(71) Applicant: Invensas Corporation, San Jose, CA (US)

(72) Inventors: Charles G. Woychik, San Jose, CA (US); Cyprian Emeka Uzoh, San Jose, CA (US); Hiroaki Sato, Yokohama (JP)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/171,604

(22) Filed: Jun. 2, 2016

(65) Prior Publication Data

US 2016/0276296 A1     Sep. 22, 2016

Related U.S. Application Data

(60) Continuation of application No. 14/628,645, filed on Feb. 23, 2015, now Pat. No. 9,362,204, which is a
(Continued)

(51) Int. Cl.
*H01L 23/58* (2006.01)
*H01L 23/00* (2006.01)
(Continued)

(52) U.S. Cl.
CPC .......... *H01L 23/562* (2013.01); *H01L 21/486* (2013.01); *H01L 21/4857* (2013.01);
(Continued)

(58) Field of Classification Search
CPC ............. H01L 23/562; H01L 23/49827; H01L 23/49822; H01L 21/486; H01L 21/46898;
(Continued)

(56) References Cited

U.S. PATENT DOCUMENTS

| | | | |
|---|---|---|---|
| 2001/0012643 A1* | 8/2001 | Asada | H01L 21/563 438/107 |
| 2002/0074637 A1* | 6/2002 | McFarland | H01L 21/563 257/686 |

(Continued)

FOREIGN PATENT DOCUMENTS

| | | |
|---|---|---|
| DE | 102009012643 A1 | 10/2009 |
| WO | 0245162 A2 | 6/2002 |
| WO | 03100854 A2 | 12/2003 |

OTHER PUBLICATIONS

International Search Report and Written Opinion for Application No. PCT/US2013/059520 dated Jan. 7, 2014.

*Primary Examiner* — Thinh T Nguyen
(74) *Attorney, Agent, or Firm* — Lerner, David, Littenberg, Krumholz & Mentlik, LLP

(57) ABSTRACT

A composite interposer can include a substrate element and a support element. The substrate element can have first and second opposite surfaces defining a thickness of 200 microns or less, and can have a plurality of contacts exposed at the first surface and electrically conductive structure extending through the thickness. The support element can have a body of at least one of dielectric or semiconductor material exposed at a second surface of the support element, openings extending through a thickness of the body, conductive vias extending within at least some of the openings in a direction of the thickness of the body, and terminals exposed at a first surface of the support element. The second surface of the support element can be united with the second surface of the substrate element. The terminals can be electrically connected with the contacts through the conductive vias and the electrically conductive structure.

20 Claims, 4 Drawing Sheets

Related U.S. Application Data division of application No. 13/613,611, filed on Sep. 13, 2012, now Pat. No. 8,963,335.

(51) Int. Cl.
| | | |
|---|---|---|
| *H01L 23/48* | (2006.01) | |
| *H01L 21/768* | (2006.01) | |
| *H01L 23/498* | (2006.01) | |
| *H01L 25/065* | (2006.01) | |
| *H01L 21/48* | (2006.01) | |
| H01L 23/433 | (2006.01) | |
| H01L 25/16 | (2006.01) | |
| H01L 25/18 | (2006.01) | |

(52) U.S. Cl.
CPC ...... *H01L 21/76898* (2013.01); *H01L 23/481* (2013.01); *H01L 23/49822* (2013.01); *H01L 23/49827* (2013.01); *H01L 23/49833* (2013.01); *H01L 24/03* (2013.01); *H01L 25/0652* (2013.01); H01L 23/4334 (2013.01); H01L 24/13 (2013.01); H01L 24/14 (2013.01); H01L 24/16 (2013.01); H01L 24/48 (2013.01); H01L 24/73 (2013.01); H01L 25/167 (2013.01); H01L 25/18 (2013.01); H01L 2224/0401 (2013.01); H01L 2224/131 (2013.01); H01L 2224/14181 (2013.01); H01L 2224/16145 (2013.01); H01L 2224/16225 (2013.01); H01L 2224/48227 (2013.01); H01L 2224/73253 (2013.01); H01L 2225/06513 (2013.01); H01L 2225/06517 (2013.01); H01L 2225/06589 (2013.01); H01L 2924/00014 (2013.01); H01L 2924/01322 (2013.01); H01L 2924/12041 (2013.01); H01L 2924/12042 (2013.01); H01L 2924/1431 (2013.01); H01L 2924/1434 (2013.01); H01L 2924/157 (2013.01); H01L 2924/15311 (2013.01); H01L 2924/181 (2013.01); H01L 2924/1815 (2013.01); H01L 2924/18161 (2013.01); H01L 2924/19105 (2013.01); H01L 2924/19106 (2013.01); H01L 2924/3011 (2013.01)

(58) Field of Classification Search
CPC . H01L 25/0652; H01L 21/4857; H01L 24/03; H01L 23/481; H01L 24/13; H01L 24/14; H01L 25/167; H01L 25/18
USPC ............... 438/637, 667, 108, 109, 639, 675; 257/747, 686, 774, 777, E21.499, 257/E23.024
See application file for complete search history.

(56) References Cited

U.S. PATENT DOCUMENTS

| | | |
|---|---|---|
| 2003/0146510 A1 | 8/2003 | Chien |
| 2005/0194180 A1 | 9/2005 | Kirby et al. |
| 2006/0027934 A1 | 2/2006 | Edelstein et al. |
| 2006/0055028 A1 | 3/2006 | Hasunuma |
| 2008/0036061 A1 | 2/2008 | Chainer |
| 2008/0157361 A1 | 7/2008 | Wood et al. |
| 2008/0246136 A1 | 10/2008 | Haba et al. |
| 2009/0267238 A1 | 10/2009 | Joseph et al. |
| 2010/0038772 A1 | 2/2010 | Taguchi et al. |
| 2010/0276796 A1 | 11/2010 | Andry et al. |
| 2011/0024167 A1 | 2/2011 | Hashimoto |
| 2011/0133342 A1 | 6/2011 | Arai |
| 2012/0001895 A1 | 1/2012 | Lin |
| 2012/0018863 A1 | 1/2012 | Oganesian et al. |
| 2012/0018868 A1 | 1/2012 | Oganesian et al. |
| 2012/0018893 A1 | 1/2012 | Oganesian et al. |
| 2012/0018894 A1 | 1/2012 | Oganesian et al. |
| 2012/0020026 A1 | 1/2012 | Oganesian et al. |
| 2012/0153445 A1 | 6/2012 | Son et al. |
| 2012/0205815 A1* | 8/2012 | Yang .................. H01L 25/0657 257/774 |
| 2012/0313239 A1 | 12/2012 | Zohni |
| 2012/0313253 A1 | 12/2012 | Nakadaira et al. |
| 2013/0063918 A1 | 3/2013 | Haba et al. |

* cited by examiner

US 9,780,042 B2

TUNABLE COMPOSITE INTERPOSER

CROSS-REFERENCE TO RELATED APPLICATION

This application is a continuation of U.S. Application Ser. No. 14/628,645, filed on Feb. 23, 2015, now U.S. Pat. No. 9,362,204, which is a divisional of U.S. Application Ser. No. 13/613,611, filed on Sep. 13, 2012, now U.S. Pat. No. 8,963,335, the disclosures of which are incorporated herein by reference in their entireties.

BACKGROUND OF THE INVENTION

The present invention relates to packaging of microelectronic devices and interposer structures, especially conductive via structures and methods of forming such via structures in semiconductor and interposer packages.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a second surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

Through-silicon vias (TSVs) are used to connect the bond pads with a second face of the semiconductor chip opposite the first face (e.g., a first surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Conventional vias may have reliability challenges because of a non-optimal stress distribution radiating from the vias and a mismatch of the coefficient of thermal expansion (CTE) between a semiconductor chip, for example, and the structure to which the chip is bonded. For example, when conductive vias within a semiconductor chip are insulated by a relatively thin and stiff dielectric material, significant stresses may be present within the vias due to CTE mismatch between the conductive material of the via and the material of the substrate. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via and interposer via formation and interconnection, there is still a need for improvements in order to minimize the size of semiconductor chips and interposer structures, while enhancing electrical interconnection reliability. These attributes of the present invention may be achieved by the construction of the components and the methods of fabricating components as described hereinafter.

BRIEF SUMMARY OF THE INVENTION

In accordance with an aspect of the invention, a composite interposer can include a substrate element and a support element. The substrate element can consist essentially of at least one of dielectric or semiconductor material. The substrate element can have first and second opposite surfaces defining a thickness of 200 microns or less, and can have a plurality of contacts exposed at the first surface and electrically conductive structure extending through the thickness. The support element can have a body of at least one of dielectric or semiconductor material exposed at a second surface of the support element. The second surface of the support element can be united with the second surface of the substrate element. The body can have a coefficient of thermal expansion ("CTE") of less than 12 parts per million per degree Celsius ("ppm/° C.").

The support element can also have openings extending through a thickness of the body between the second surface of the support element and a first surface opposite thereto. The support element can also have a plurality of electrically conductive vias extending within at least some of the openings in a direction of the thickness of the body. The support element can also have terminals exposed at the first surface of the support element that are configured to electrically connect the interposer with a component external to the interposer. The terminals can be electrically connected with the contacts through the conductive vias and the electrically conductive structure.

In a particular embodiment, the contacts can have a smaller minimum pitch than the terminals. In one example, the contacts can have a minimum pitch that is at least five times less than a minimum pitch of the terminals. In an exemplary embodiment, the electrically conductive structure extending through the substrate element thickness can include a plurality of conductive vias. A minimum pitch between any two adjacent ones of the conductive vias of the substrate element can be less than or equal to a minimum pitch between any two adjacent ones of the conductive vias extending through the openings of the support element. In a particular example, the electrically conductive structure extending through the substrate element thickness can include a plurality of conductive vias. A minimum pitch between any two adjacent ones of the conductive vias of the substrate element can be greater than a minimum pitch between any two adjacent ones of the conductive vias extending through the openings of the support element.

In one embodiment, the electrically conductive structure extending through the substrate element thickness can include a plurality of conductive vias. A quantity of the conductive vias of the substrate element can be equal to or greater than a quantity of the conductive vias extending through the openings of the support element. In a particular embodiment, the electrically conductive structure extending through the substrate element thickness can include a plurality of conductive vias. A quantity of the conductive vias of the substrate element can be less than a quantity of the conductive vias extending through the openings of the support element. In one example, the thickness of the substrate element can be less than the thickness of the support element. In an exemplary embodiment, the thickness of the substrate element can be less than one-fifth the thickness of the support element.

In a particular example, the thickness of the support element can be at least 1.5 times the thickness of the substrate element. The Young's modulus of the support element can be greater than 60 GPa. In one embodiment, the thickness of the support element can be at least 1.5 times the thickness of the substrate element. The Young's modulus of the support element can be at least 1.3 times the Young's modulus of the substrate. In a particular embodiment, the body of the support element can consist essentially of dielectric material. In one example, the substrate element can consist essentially of a semiconductor material. In an exemplary embodiment, the body of the support element can consist essentially of glass, ceramic, or a low-k material. In a particular example, the body of the support element can have a CTE that is within 30 % of the CTE of the substrate element.

In one embodiment, the body of the support element can consist essentially of a mesophase material or a liquid crystal material. In a particular embodiment, the composite interposer can also include a compliant dielectric layer extending along the first surface of the support element. At least some of the terminals can at least partially overlie the compliant dielectric layer. In one example, ends of the conductive vias adjacent the terminals can be movable in a first direction of the at least one lateral direction relative to the substrate element. In an exemplary embodiment, the conductive vias can be configured to reduce stresses applied to the composite interposer from differential thermal expansion relative to a component attached thereto adjacent the conductive vias.

In a particular example, an outer surface of each conductive via may not conform to a contour of an inner surface of the corresponding one of the openings. In one embodiment, each conductive via can substantially entirely fill the corresponding one of the openings. In a particular embodiment, each conductive via can have a first width at the first surface of the support element and a second width at the second surface of the support element, the second width being different than the first width. In one example, at least some of the conductive vias can include voids dispersed within a conductive material therein. In an exemplary embodiment, at least some of the conductive vias can be wire bonds. In a particular example, each of at least some of the conductive vias can be separated by a compliant dielectric material from an inner surface of the opening in which it extends.

In one embodiment, the compliant dielectric material can consist essentially of polyimide or silicone. The compliant dielectric material can have a modulus of elasticity less than 3 GPa. In a particular embodiment, the compliant dielectric material can consist essentially of at least one of a foam material or a low-k material. In one example, at least some of the openings can be substantially entirely filled with the compliant dielectric material. In an exemplary embodiment, at least some of the openings can each define a rounded corner between the inner surface of the opening and the first surface of the support element. In a particular example, each of at least some of the conductive vias can be separated from an inner surface of the opening in which it extends by a void extending therebetween. In one embodiment, at least some of the terminals may not overlie the first surface of the support element. In one example, at least some of the terminals may not overlie an opening of the support element.

In a particular embodiment, one or more of the openings can each have a plurality of the conductive vias extending therein. In one example, at least one of the openings that has a plurality of the conductive vias extending therein can have a length extending in a first direction of the at least one lateral direction, and a width extending in a second direction of the at least one lateral direction that is transverse to the first direction, the length being at least two times the width. In an exemplary embodiment, two or more of the openings can have separate portions extending from the second surface of the support element towards the first surface thereof, and a single joined portion extending from the separate portions to the first surface of the support element.

In a particular example, one or more of the openings can each be entirely filled with a dielectric material. In one embodiment, at least one of the one or more of the openings can have a length extending in a first direction of the at least one lateral direction, and a width extending in a second direction of the at least one lateral direction that is transverse to the first direction, the length being at least two times the width. In a particular embodiment, the composite interposer can also include a conductor layer extending along at least one of the second surfaces of the substrate element or the support element. The conductor layer can provide direct electrical connection between the conductive vias and the electrically conductive structure.

In accordance with another aspect of the invention, a composite interposer can include a substrate element and a support element. The substrate element can consist essentially of at least one of dielectric or semiconductor material. The substrate element can have first and second opposite surfaces defining a thickness of 200 microns or less, and can have a plurality of contacts exposed at the first surface and electrically conductive structure extending through the thickness. The support element can have a body of at least one of dielectric or semiconductor material exposed at a second surface of the support element. The second surface of the support element can face the second surface of the substrate element. The body can have a CTE of less than 12 ppm/° C.

The support element can also have openings extending through a thickness of the body between the second surface of the support element and a first surface opposite thereto.

The support element can also have a plurality of electrically conductive vias extending within at least some of the openings in a direction of the thickness of the body. The support element can also have terminals exposed at the first surface of the support element that are configured to electrically connect the interposer with a component external to the interposer. The terminals can be electrically connected with the contacts through the conductive vias and the electrically conductive structure. The support element can be joined with the substrate element by a plurality of conductive joining units electrically connecting the conductive vias and the electrically conductive structure.

In accordance with yet another aspect of the invention, a microelectronic assembly can include a microelectronic element having a surface bearing element contacts thereon and a composite interposer. The composite interposer can include a substrate element having first and second opposite surfaces and a support element assembled with the substrate element. The substrate element can also have a plurality of contacts exposed at the first surface and electrically conductive structure extending through a thickness of the substrate element. The microelectronic element can be assembled with the substrate element such that at least some of the contacts are electrically connected with at least some of the element contacts.

The support element can have a body of at least one of dielectric or semiconductor material exposed at a second surface of the support element. The second surface of the support element can face the second surface of the substrate element. The support element can have openings extending through a thickness of the body between the second surface of the support element and a first surface opposite thereto. The support element can have a plurality of electrically conductive vias extending within at least some of the openings in a direction of the thickness of the body. The support element can have terminals exposed at the first surface of the support element that are configured to electrically connect the interposer with a component external to the microelectronic assembly. The terminals can be electrically connected with the contacts through the conductive vias and the electrically conductive structure.

In one example, the microelectronic element and the substrate element can consist essentially of silicon. In an exemplary embodiment, the substrate element can define a thickness of 200 microns or less between the first and second surfaces thereof. In a particular example, the body of the support element can have a CTE of less than 12 ppm/° C. In one embodiment, the at least some of the element contacts can face and can be joined to the at least some of the contacts of the substrate element. In a particular embodiment, a rear surface of the microelectronic element can face the first surface of the substrate element. The at least some of the element contacts can be electrically connected to the at least some of the contacts of the substrate element through conductive leads. At least some of the conductive leads can include wire bonds.

In one example, the microelectronic element can embody a greater number of active devices to provide memory storage array function than any other function. In an exemplary embodiment, the microelectronic assembly can also include an additional microelectronic element having a surface bearing element contacts thereon and including a semiconductor chip configured predominantly to perform a logic function. At least some of the contacts of the substrate element can be electrically connected with at least some of the element contacts of the additional microelectronic element. In a particular example, the additional microelectronic element can include a buffer chip configured to regenerate signals received and to output the regenerated signals to the microelectronic element. In one embodiment, the microelectronic assembly can also include an encapsulant extending between the microelectronic element and the additional microelectronic element in a horizontal direction parallel to the first surface of the substrate element.

In a particular embodiment, the encapsulant can be a topographical overmold having a first surface portion that can be parallel to a rear surface of the microelectronic element and a second surface portion that can be parallel to a rear surface of the additional microelectronic element. The first surface portion can extend in a different plane than the second surface portion. In one example, the microelectronic assembly can also include an additional microelectronic element having a surface bearing element contacts thereon. At least some of the contacts of the substrate element can be electrically connected with at least some of the element contacts of the additional microelectronic element. The element contacts of the microelectronic element can be directly electrically connected to the element contacts of the additional microelectronic element through the electrically conductive structure of the substrate element for transfer of signals between the microelectronic elements. The signals can represent at least one of data or instructions. The microelectronic elements can be adapted to simultaneously execute a set of instructions of a given thread of a process.

In an exemplary embodiment, the microelectronic element and the additional microelectronic element can have substantially identical structure. In a particular example, the microelectronic element can include a plurality of stacked electrically interconnected semiconductor chips. In one embodiment, each of the chips can embody a greater number of active devices to provide memory storage array function than any other function. In a particular embodiment, the plurality of stacked semiconductor chips can include a first semiconductor chip having the element contacts thereon joined to the contacts of the substrate element, and at least one second semiconductor chip overlying a rear surface of the first semiconductor chip remote from the first surface of the substrate element and electrically interconnected with the first semiconductor chip. The at least one second semiconductor chip can embody a greater number of active devices to provide memory storage array function than any other function.

In one example, the microelectronic assembly can also include a heat spreader in thermal communication with the microelectronic element. In an exemplary embodiment, the microelectronic assembly can also include a conductor layer extending along at least one of the second surfaces of the substrate element or the support element. The conductor layer can provide direct electrical connection between the conductive vias and the electrically conductive structure. In a particular example, the support element can be joined with the substrate element by a plurality of conductive joining units electrically connecting the conductive vias and the electrically conductive structure.

In one embodiment, a system can include a microelectronic assembly as described above mounted to a circuit panel. At least some of the terminals of the microelectronic assembly can be joined to and electrically connected with panel contacts exposed at a surface of the circuit panel. In a particular embodiment, the terminals can be electrically connected to the panel contacts by conductive leads that at least partially include wire bonds. In one example, the terminals can be electrically connected to the panel contacts by conductive leads that at least partially include conductive pillars. In an exemplary embodiment, the terminals can be electrically connected to the panel contacts by conductive leads that at least partially include a conductive joining material.

In a particular example, the support element can be joined with the substrate element by a first plurality of conductive joining units electrically connecting the conductive vias and the electrically conductive structure. The support element can be joined with the circuit panel by a second plurality of joining units electrically connecting the conductive vias and the panel contacts. In one embodiment, the first plurality of joining units can contain an equal or greater number of joining units than the second plurality of joining units. In a particular embodiment, the first plurality of joining units can contain a fewer number of joining units than the second plurality of joining units.

Further aspects of the invention provide systems that incorporate structures according to the foregoing aspects of the invention in conjunction with other electronic devices. In one example, a system can include a microelectronic assembly as described above and one or more other electronic components electrically connected to the microelectronic assembly. In an exemplary embodiment, the system can also include a housing, the microelectronic assembly and the one or more other electronic components being assembled with the housing. In a particular example, the microelectronic assembly can be a first microelectronic assembly, the system also including a second microelectronic assembly as described above. In one embodiment, a module can include a plurality of microelectronic assemblies as described above, each microelectronic assembly mounted to, and electrically connected with a second circuit panel for transport of signals to and from each microelectronic assembly.

In accordance with still another aspect of the invention, a method of fabricating a microelectronic assembly can include uniting exposed surfaces of at least one of dielectric or semiconductor material of a substrate element and a support element with one another. The substrate element can have first and second opposite surfaces defining a thickness of 200 microns or less. The substrate element can have a plurality of contacts exposed at the first surface and electrically conductive structure extending through the thickness. The exposed surface of the at least one of dielectric or semiconductor material of the substrate element can be the second surface thereof.

The support element can have a body having first and second opposite surfaces and a CTE of less than 12 ppm/° C. The support element can have openings extending between the first and second surfaces of the support element through a thickness of the body. The exposed surface of the at least one of dielectric or semiconductor material of the support element can be the second surface thereof. The method can also include forming electrically conductive vias extending within the openings and terminals exposed at the first surface of the support element. The terminals can be electrically connected with the contacts through the conductive vias and the electrically conductive structure.

In a particular embodiment, the step of forming the conductive vias and the terminals can form at least some of the terminals integrally with the conductive vias as ends of the conductive vias. In one example, the conductive vias can be formed as wire bonds. In an exemplary embodiment, the conductive vias can be formed by depositing a metal onto inner surfaces of the openings. In a particular example, the method can also include forming a compliant dielectric material extending within the openings. The conductive vias can be formed extending within an aperture extending through the compliant dielectric material. In one embodiment, the method can also include forming a compliant dielectric material extending within at least some of the openings overlying outer surfaces of the conductive vias, such that at least a portion of the compliant dielectric material is separated from an inner surface of the opening in which it extends by a void extending therebetween.

In a particular embodiment, the method can also include forming a compliant dielectric layer extending along the first surface of the support element. In one example, the method can also include forming a conductor layer extending along at least one of the second surfaces of the substrate element or the support element. The conductor layer can provide direct electrical connection between the conductive vias and the electrically conductive structure. In an exemplary embodiment, the method can also include assembling a microelectronic element with the substrate element. The microelectronic element can have a surface bearing element contacts thereon. At least some of the contacts of the substrate element can be electrically connected with at least some of the element contacts. In a particular example, the surface of the microelectronic element can face the first surface of the substrate. The assembling step can include joining at least some of the element contacts to at least some of the contacts of the substrate element.

In one embodiment, the assembling step can include electrically connecting the at least some of the contacts of the substrate with the at least some of the element contacts through conductive leads. At least some of the conductive leads can include wire bonds. In a particular embodiment, the method can also include assembling an additional microelectronic element with the substrate element. The additional microelectronic element can have a surface bearing element contacts thereon. At least some of the contacts of the substrate element can be electrically connected with at least some of the element contacts of the additional microelectronic element. In one example, the microelectronic element can embody a greater number of active devices to provide memory storage array function than any other function. The additional microelectronic element can include a semiconductor chip configured predominantly to perform a logic function.

In an exemplary embodiment, the method can also include assembling a circuit panel with the support element. At least some of the terminals of the microelectronic assembly can be joined to and electrically connected with panel contacts exposed at a surface of the circuit panel. In a particular example, the terminals can be electrically connected to the panel contacts by conductive leads that at least partially include wire bonds. In one embodiment, the terminals can be electrically connected to the panel contacts by conductive leads that at least partially include conductive pillars. In a particular embodiment, the terminals can be electrically connected to the panel contacts by conductive leads that at least partially include a conductive joining material.

In accordance with another aspect of the invention, a method of fabricating a microelectronic assembly can include assembling a microelectronic element with a composite interposer. The microelectronic element can have a surface bearing element contacts thereon. The composite interposer can include a substrate element consisting essentially of at least one of dielectric or semiconductor material and a support element. The substrate element can have first and second opposite surfaces defining a thickness of 200 microns or less. The substrate element can have a plurality of contacts exposed at the first surface thereof and electrically conductive structure extending through the thickness. The support element can have a body of at least one of dielectric or semiconductor material exposed at a second surface of the support element. The second surface of the support element can be united with the second surface of the substrate element. The body can have a CTE of less than 12 ppm/° C.

The support element can have openings extending through a thickness of the body between the second surface of the support element and a first surface opposite thereto. The support element can have a plurality of electrically conductive vias extending within at least some of the openings in a direction of the thickness of the body. The support element can have terminals exposed at the first surface of the support element that are configured to electrically connect the interposer with a component external to the interposer. The terminals can be electrically connected with the contacts through the conductive vias and the electrically conductive structure. The assembling step can include electrically connecting at least some of the contacts of the substrate element with at least some of the element contacts. In one example, the method can also include assembling a circuit panel with the support element. At least some of the terminals of the microelectronic assembly can be joined to and electrically connected with panel contacts exposed at a surface of the circuit panel.

DETAILED DESCRIPTION

Figure 1A:
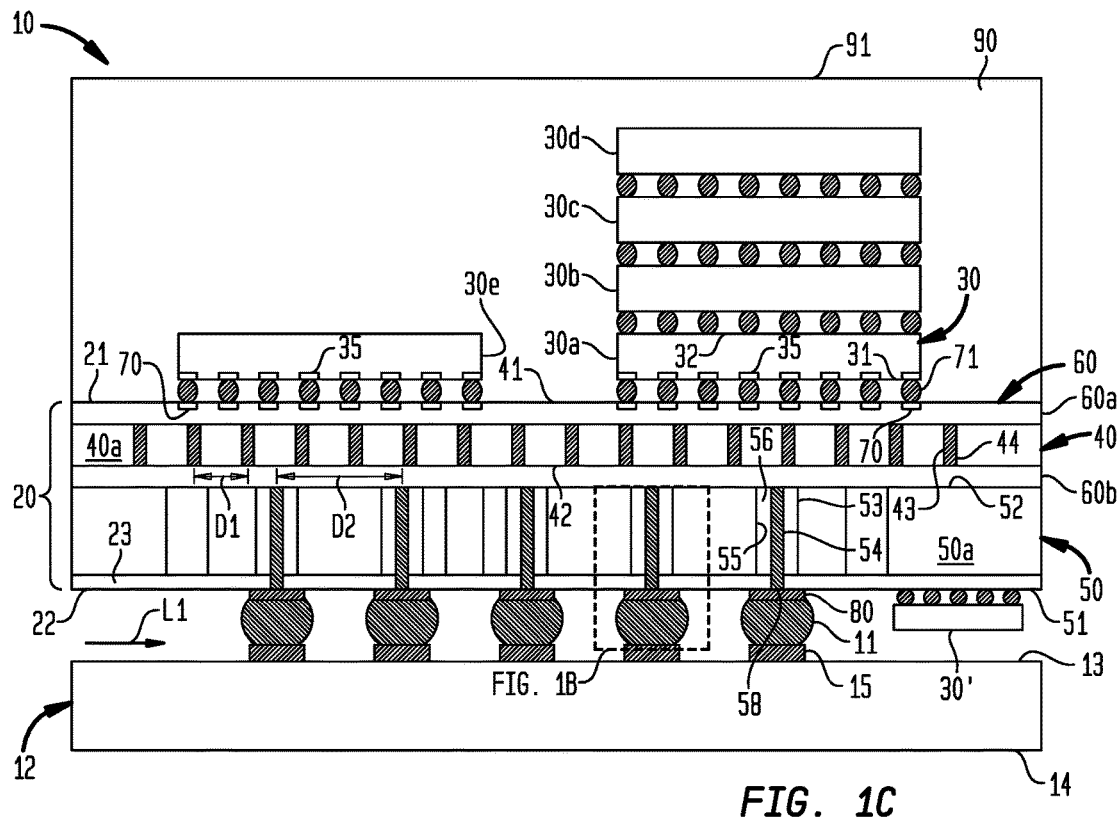
FIG. 1A is a side sectional view illustrating a microelectronic assembly in accordance with an embodiment of the invention.

As illustrated in FIG. 1A, a microelectronic assembly 10 can include an interconnection element 20 having a first surface 21 and a second surface 22 opposite therefrom, one or more microelectronic elements 30 assembled with the interconnection element, an encapsulant 90 at least partially covering the microelectronic elements 30, and a circuit panel 12 assembled with the interconnection element.

In FIG. 1A, the directions parallel to the first surface 21 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure.

The interconnection element 20 can include a substrate element 40, a support element 50 united with the substrate element, conductor layers 60, contacts 70 exposed at the first surface 21 of the interconnection element, and terminals 80 exposed at the second surface 22 of the interconnection element.

As shown in FIG. 1A, the support element 40 can typically be laminated with the substrate element 50. For example, an adhesive layer can unite confronting surfaces of the support element 40 and the substrate element 50. Such an adhesive layer can be a portion of the conductor layer 60b described below, or such an adhesive layer can be in addition to the conductor layer 60b.

In one embodiment, or one or both of the substrate element 40 or the support element 50 can include a not-fully-cured material, e.g., a "B-stage material," when confronting surfaces of the support element and the substrate element are brought into contact with one another, and curing of the B-stage material can take place thereafter, which in some cases may be assisted by application of heat, pressure, or both. Such a B-stage material layer can be a portion of the conductor layer 60b described below, or such a B-stage material layer can be in addition to the conductor layer 60b.

The interconnection element 20 can further include an insulating dielectric layer 23 exposed at the second surface 22. Such a dielectric layer can electrically insulate conductive elements from the substrate element 40. This dielectric layer can be referred to as a "passivation layer" of the substrate element 40. The dielectric layer 23 can include an inorganic or organic dielectric material or both. The dielectric layer may include an electrodeposited conformal or non-conformal coating or other dielectric material, for example, a photoimageable polymeric material, for example, a solder mask material.

In a particular example, the dielectric layer 23 can be compliant. Such a compliant dielectric layer 23 can be formed from a material having a relatively low elastic modulus, for example, a Young's modulus of less than about 6 GPa. In a particular embodiment, the compliant dielectric layer 23 can have elastic properties comparable to those of soft rubber about 20 to 70 Shore A durometer hardness. For example, the compliant dielectric layer 23 can be a dielectric, and it can have a material structure formed from materials having a density or hardness of a material used as a filler in compositions such as flexibilized epoxy, silicone, a low modulus epoxy, a TEFLON based material, a foam type material, a liquid-crystal polymer, a thermoset polymer, a fluoropolymer, a thermoplastic polymer, polyimide, polytetrafluoroethylene (PTFE), perfluoroalkoxy (PFA), fluorinated ethylene propylene (FEP), and polyfluoroethylene (PTFE) or like compositions.

In some embodiments, for example, where the body 50a of the support element 50 consists essentially of a dielectric material, or when it is desired to ground one or more of the terminals 80 to the body of the support element, the dielectric layer 23 can be omitted, and the terminals can be formed in contact with the first surface 51 of the support element.

A microelectronic element 30, of which a plurality are shown in FIG. 1A, may in a particular example have a front surface 31 facing the first surface 21 of the interconnection element 20, as shown in FIG. 1A. In some embodiments, a rear surface of one or more of the microelectronic elements 30 can face the first surface 21. In one example, at least one of the microelectronic elements 30, for example, the microelectronic element 30a, can be flip-chip bonded to contacts 70 exposed at the first surface 21 of the interconnection element 20. Although the microelectronic elements 30 are shown with the front surfaces 31 thereof facing the first surface 21 of the interconnection element 20, in a particular embodiment, the front surface 31 of one or more of the microelectronic elements can face the second surface 22 of the interconnection element.

In one example, one or more of the microelectronic elements 30 can be bare chips or microelectronic units each incorporating a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface.

In any of the embodiments described herein, one or more of the microelectronic elements 30 can be implemented in one or more of the following technologies: DRAM, NAND flash memory, RRAM ("resistive RAM" or "resistive random access memory"), phase-change memory ("PCM"), magnetoresistive random access memory, e.g. such as may embodiment tunnel junction devices, static random access memory ("SRAM"), spin-torque RAM, or content-addressable memory, among others.

In a particular example, a microelectronic element 30 that includes a memory storage element can have at least a memory storage array function, but the microelectronic element may not be a full-function memory chip. Such a microelectronic element may not have a buffering function itself, but it may be electrically connected to other microelectronic elements in a stack of microelectronic elements, wherein at least one microelectronic element in the stack has a buffering function (the buffering microelectronic element could be a buffer chip, a full-function memory chip, or a controller chip).

In other examples, one or more of the microelectronic elements in any of the packages described herein can be configured to predominantly provide memory storage array function, such as the microelectronic element 30 a shown in FIG. 1A, in that one or more of the microelectronic elements can have a greater number of active devices, e.g., transistors, configured to provide memory storage array function than any other function, e.g., as flash memory, DRAM or other type of memory.

Such a microelectronic element that can be configured to predominantly provide memory storage array function can be arranged in a package together with another microelectronic element or "logic chip" that is configured to predominantly provide logic function, such as the microelectronic element 30e shown in FIG. 1A. In a particular embodiment, the logic chip can be a programmable or processor element such as a microprocessor or other general purpose computing element. The logic chip can be a microcontroller element, graphics processor, floating point processor, co-processor, digital signal processor, etc. In a particular embodiment, the logic chip can predominantly perform hardware state machine functions, or otherwise be hard-coded to serve a particular function or purpose. Alternatively, the logic chip can be an application specific integrated circuit ("ASIC") or field programmable gate array ("FPGA") chip. In such variation, the package then may be a "system in a package" ("SIP").

In another variation, a microelectronic element in any of the packages described herein can have both logic and memory function embedded therein, such as a programmable processor having one or more associated memory storage arrays embedded therewith in the same microelectronic element. Such microelectronic element is sometimes referred to as a "system-on-a-chip" ("SOC"), in that logic such as a processor is embedded together with other circuitry such as a memory storage array or circuitry for performing some other function that may be a specialized function.

Each microelectronic element 30 can have a plurality of electrically conductive element contacts 35 exposed at the front surface 31 thereof. The contacts 35 of each microelectronic element 30 can be arranged in one or more columns disposed in a central region of the front surface 31 that occupies a central portion of an area of the front surface. The central region, for example, may occupy an area of the front surface 31 that includes a middle third of the shortest distance between opposed peripheral edges of the microelectronic element 30. In a particular example, the contacts 35 can be arranged along an axis that bisects the microelectronic element 30 or along an axis parallel to an axis that bisects the microelectronic element. Such example may occur when the contacts 35 are disposed in a central region of the front surface 31, or in other cases when contacts are not confined to a central region as described.

In a particular example, each of the microelectronic elements 30 can be functionally and mechanically equivalent to the other ones of the microelectronic elements, such that each microelectronic element can have the same pattern of electrically conductive contacts 35 at the front surface 31 with the same function, although the particular dimensions of the length, width, and height of each microelectronic element can be different than that of the other microelectronic elements.

The microelectronic assembly 10 can include two microelectronic elements 30 including first and second microelectronic elements 30a and 30b that are stacked relative to one another. In the embodiment shown in FIG. 1A, the front surface 31 of the first microelectronic element 30a can confront the first surface 21 of the interconnection element 20, and the front surface 31 of the second microelectronic element 30b and the rear surface 32 of the first microelectronic element 30a can face one another. At least a portion of the front surface 31 of the second microelectronic element 30*b* can overlie at least a portion of the rear surface 32 of the first microelectronic element 30*a*. Additional microelectronic elements 30*c* and 30*d* can be stacked relative to the microelectronic elements 30*a* and 30*b*, as shown in FIG. 1A. In a particular example, all of the microelectronic elements 30*a*, 30*b*, 30*c*, and 30*d* can be configured to predominantly provide memory storage array function. In one example, one or more of the microelectronic elements 30*a*, 30*b*, 30*c*, and 30*d* can include a memory storage control device.

Although the microelectronic elements 30 are shown in FIG. 1A as being arranged in a flip-chip bonded stack, with the front surfaces 31 thereof facing the first surface 21 of the interconnection element 20, in other embodiments, one or more of the microelectronic elements may be mounted and electrically connected to other microelectronic elements and/or the interconnection element in other ways. For example, any of the microelectronic elements 30 can be disposed with the rear surface 32 thereof facing the first surface 21 of the interconnection element 20. In one example, the contacts 35 of such microelectronic elements 30 can be connected to contacts 70 of the interconnection element 20 by conductive structure extending above the front surface 31 thereof, for example, which may be or include wire bonds, among others.

As used herein, a "lead" is a portion of or the entire electrical connection extending between two electrically conductive elements. For example, a lead may include wire bonds, joining units such as solder balls, conductive vias, and conductive traces extending between contacts of a first element such as the contacts 31 of the microelectronic element 30 *a* and contacts of a second element such as the contacts 15 of the circuit panel 12.

In a particular example, instead of or in addition to the aforementioned microelectronic elements 30, one or more passive elements 30', such as a decoupling capacitor, can be mounted to the first and/or second surfaces 21, 22 of the interconnection element 20 and can be electrically connected with electrically conductive elements of the interconnection element. In a particular example, one or more of the passive elements 30' can be a control device or a timing element device. Such passive elements 30' can be electrically connected to internal power supply and/or ground buses inside the microelectronic assembly 10.

The substrate element 40 can have first and second opposed surfaces 41 and 42, and first conductive vias 44 extending in a direction of a thickness of the substrate element between the first and second surfaces. The substrate element 40 can include a body 40*a* of at least one of dielectric or semiconductor material. In one embodiment, the body 40*a* can be made essentially of a semiconductor material such as silicon or gallium arsenide, for example. In one example, the body 40*a* of the substrate element 40 can be made essentially of silicon carbide. In particular embodiments, a body 40*a* of silicon carbide can be doped so that active devices can be included therein. In an exemplary embodiment, the body 40*a* of the substrate element 40 can consist essentially of low thermal expansion glass (e.g., quartz). In one example, the substrate element 40 can be a light emitting diode ("LED").

In embodiments where the substrate element 40 includes a semiconductor body 40*a*, made for example from silicon, one or a plurality of semiconductor devices (e.g., transistors, diodes, etc.) can be disposed in one or more active device regions thereof located at and/or below the first surface 41 of the substrate element. In a particular example, such active device regions within the body 40*a* of the substrate element 40 can be located below a conductor layer 60*a* as described below.

The support element 50 can include a body 50*a* of at least one of dielectric or semiconductor material, first and second opposed surfaces 51 and 52, openings 53 extending through a thickness of the body between the first and second surfaces, and second conductive vias 54 extending within at least some of the openings. In one example, the second conductive vias 54 can extend within at least some of the openings 53 in a direction of the thickness of the body 50*a*. The second conductive vias 54 can be electrically connected with the at least some of the contacts 70 through the first conductive vias 44.

In one embodiment, one or more of the openings 53 can each have a plurality of second conductive vias 54 extending therein. In a particular embodiment, one or more of the openings 53 can each have a single conductive via 54 extending therein. The openings 30 can be arranged in any top-view geometric configuration, including for example, an m×n array, each of m and n being greater than 1.

In one example, the thickness of the substrate element 40 between the first and second surfaces 41, 42 thereof can be less than the thickness of the support element 50 between the first and second surfaces 51, 52 thereof. In a particular embodiment, the thickness of the substrate element 40 between the first and second surfaces 41, 42 thereof can be less than one-fifth the thickness of the support element 50 between the first and second surfaces 51, 52 thereof.

In one embodiment, the thickness of the support element 50 can be is at least 1.5 times the thickness of the substrate element 40, and the Young's modulus of the support element can be greater than 60 GPa. In a particular example, the thickness of the support element 50 can be is at least 1.5 times the thickness of the substrate element 40, and the Young's modulus of the support element can be greater than 120 GPa. In an exemplary embodiment, the thickness of the support element 50 can be at least 1.5 times the thickness of the substrate element 40, and the Young's modulus of the support element can be equal to or greater than the Young's modulus of the substrate element. In one example, the thickness of the support element 50 can be at least 1.5 times the thickness of the substrate element 40, and the Young's modulus of the support element can be at least 1.3 times the Young's modulus of the substrate element.

In a particular example, the body 50*a* of the support element 50 can consist essentially of dielectric material, such as, for example, glass, ceramic, or liquid crystal. In one embodiment, the body 50*a* of the support element 50 can have a CTE in a plane parallel to the first surface 21 of the interconnection element 20 of less than 12 ppm/° C. In an exemplary embodiment, the body 50*a* of the support element 50 can have a CTE that is within 30% of a CTE of the substrate element 40. In one example, when the substrate element 40 is made of silicon having a CTE of approximately 3 ppm/° C., the CTE of the support element 50 can be approximately 3.5 ppm/° C.

In one example, the body 50*a* of the support element 50 can consist essentially of a semiconductor material such as silicon. In a particular embodiment, the body 40*a* of the substrate element 40 can consist essentially of silicon, and the body 50*a* of the support element 50 can consist essentially of silicon. In such an example, in some cases, the body 50*a* of the support element 50 can be manufactured according to more relaxed tolerances than the body 40*a* of the substrate element 40, and the body of the support element may in some cases consist essentially of polycrystalline semiconductor material.

In one example, the body 50a of the support element 50 can consists essentially of a mesophase material. Such a mesophase material can have a highly ordered structure, e.g., carbonaceous, alumina, titania, beryllium titanate, that can be tunable to a specific CTE by adding disorder (e.g., impurities) locally. In one embodiment, the body 50a of the support element 50 can consists essentially of carbon-based material that can be made from pitch (bitumen). In such an embodiment, the Young's modulus of the body 50a can be affected locally by orientation of the carbon-based material in a laminated structure or by chemical treatment.

In an exemplary embodiment, the CTE of the support element 50 can be tuned to approximately match the CTE of the substrate element 40, so that differential thermal expansion of the support element relative to the substrate element can be minimized In one example, the CTE of the support element 50 can be tuned by designing the structure of the body 50a of the support element to have a particular CTE, such as by introducing impurities or voids into a mesophase material or by orienting the direction of material of the body of the support element.

In a particular example, the CTE of the support element 50 can be tuned by removing material from the body 50a of the support element by forming openings 53 in a particular configuration to achieve a desired CTE. For example, the CTE of a support element 50 having a body 50a of a particular CTE can be changed by adding openings 53 that do not have second conductive vias 54 extending therein.

The openings 53 can each include inner surfaces 55 that extend from the first surface 51 of the support element 50 therethrough at an angle between 0 and 90 degrees to the horizontal plane defined by the first surface. The inner surface 55 can have a constant slope or a varying slope. For example, the angle or slope of the inner surface 55 relative to the horizontal plane defined by the first surface 51 of the support element 50 can decrease in magnitude (i.e., become less positive or less negative) as the inner surface 55 penetrates further towards the second surface 52. For example, one or more of the opening 53 can have a constant width, the openings can be tapered in a direction from the first surface 51 towards the second surface 52, or the openings can be tapered in a direction from the second surface towards the first surface.

In some examples, each opening 53 can have any three-dimensional shape, including for example, a frusto-conical shape, a cylinder, a cube, a prism, an elliptic paraboloid, a hyperboloid, or a structure bounded by a curvilinear inner surface, among others. As used herein, when a three-dimensional structure is described as having or being bounded by a curvilinear surface, a cross-section of that surface in a plane that is generally perpendicular to the first and second surfaces of the substrate element is a curve having a varying slope (e.g., a second order polynomial).

The openings 53 can have any top-view shape. For example, the openings can have a cylindrical top-view shape and a rectangular longitudinal cross-section, as shown in FIG. 1A. In one example, one or more of the openings 53 can have a channel or trench shape. In a particular embodiment, such channel-shaped openings can have a length extending in a first direction of the at least one lateral direction, and a width extending in a second direction of the at least one lateral direction that is transverse to the first direction, the length being at least two times the width. In one example, two or more of the openings 53 can each have separate portions extending from the second surface 52 of the support element 50 towards the first surface 51 thereof, and a single joined portion extending from the separate portions to the first surface of the support element.

In an exemplary embodiment, a plurality of the second conductive vias 54 can extend within a single one of the openings 53. In one example, a plurality of the second conductive vias 54 can extend within a single trench-shaped opening 53, such trench-shaped opening having a length extending in a first direction of the at least one lateral direction, and a width extending in a second direction of the at least one lateral direction that is transverse to the first direction, the length being at least two times the width.

In particular embodiments, the opening 53 and any of the other openings described herein can have various shapes, as described for example in United States Patent Application Publication Nos. 2012/0018863 and 2012/0018868, which are hereby incorporated by reference herein, and such openings can be formed using exemplary processes as described in the aforementioned applications.

As shown in FIG. 1A, one or more of the openings 53 each can be partially or entirely filled with a dielectric material 56. Such a dielectric material 56 can electrically insulate the second conductive vias 54 from the body 50a of the support element 50. In some embodiments, for example, where the body 50a of the support element 50 consists essentially of a dielectric material, or when it is desired to ground one or more of the second conductive vias 54 to the body of the support element, the dielectric material 56 can be omitted, and the second conductive vias can be formed in contact with the inner surfaces 55 of the corresponding openings 53.

The dielectric material 56 can include an inorganic or organic dielectric material or both. In a particular example, the dielectric material 56 can be compliant. The dielectric material 56 can include any of the materials described above with reference to the compliant dielectric layer 23. In a particular example, dielectric material 56 and the insulating dielectric layer 23 can be formed together as a single insulating dielectric region, or they can be formed separately as individual insulating dielectric regions.

In a particular example, ends 58 of the second conductive vias 54 adjacent the terminals 80 can be movable in a first direction, for example the direction L1, of the at least one lateral direction relative to the body 50a of the support element 50. Such movement can accommodate external loads applied to the terminals 80, such as due to thermal expansion of the circuit panel 12 relative to the interconnection element 20. An example of the movement of such movable terminals 80 is shown in FIG. 1C. As shown, a force F is applied to the joining unit 11, for example, from differential thermal expansion of the circuit panel 12 relative to the body 50a of the support element 50. The force F acts to move the terminal 80, and the movement of the terminal creates a bending load on the conductive via 54, which bends or deflects to a configuration 54'. The tip of the conductive via 54' has moved a distance D from its initial unbent position. If the force F is decreased or removed, for example, by a temperature change and decrease of the differential thermal expansion of the circuit panel 12 relative to the interconnection element 20, the conductive via 54' can bend or deflect back to its initial unbent position shown in FIG. 1B.

As used in the claims with respect to a conductive element joined to a substrate or support element body, the term "movable" means that when the support element is exposed to external loads, such as may occur as a result of thermal excursions during fabrication, testing or operation of the inventive assembly, at least a portion of the conductive element is capable of being displaced relative to the support element by the external loads applied to the conductive element through the joints with the contacts or terminals of an external element such as a circuit panel, to the extent that the displacement appreciably relieves mechanical stresses, such as those caused by differential thermal expansion which would be present in the electrical connections between the support element and the circuit panel absent such displacement.

The conductor layer 60 can each extend in at least one lateral direction, for example, the lateral direction L1, parallel to the first surface 41 of the substrate element 40. There can be one or more conductor layers 60, such as the conductor layer 60a adjacent the first surface 21 of the interconnection element 20 and the conductor layer 60b disposed between the second surface 42 of the substrate element 40 and the second surface 52 of the support element 50.

In one example, the interconnection element 20 can include a single conductor layer 60a disposed adjacent the first surface 41 of the substrate element 40, wherein the contacts 70 are electrically connected with the first conductive vias 44 through the conductor layer 60a. In one embodiment, the interconnection element 20 can include a single conductor layer 60b disposed adjacent the second surface 42 of the substrate element 40, wherein the first conductive vias 44 are electrically connected with the second conductive vias 54 through the conductor layer 60b.

In a particular embodiment, the interconnection element 20 can include both the first conductor layer 60a and the second conductor layer 60b. The first conductor layer 60a can be disposed adjacent the first surface 41 of the substrate element 40, and the contacts 70 can be electrically connected with the first conductive vias 44 through the first conductor layer 60a. The second conductor layer 60b can be disposed adjacent the second surface 42 of the substrate element 40, and the first conductive vias 44 can be electrically connected with the second conductive vias 54 through the second conductor layer 60b.

The terminals 80 can be exposed at the first surface 51 of the support element 50 for connection with a component external to the interconnection element 20, the terminals being electrically connected with the second conductive vias 54.

The interconnection element 20 can include conductive joining units 11 attached to the terminals 80 for connection with an external component. The joining units 11 can be, for example, masses of a bond metal such as solder, tin, indium, a eutectic composition or combination thereof, or another joining material such as a conductive paste or a conductive adhesive. In a particular embodiment, the joints between the terminals 80 and contacts of an external component (e.g., the circuit panel 12 shown in FIG. 1A) can include an electrically conductive matrix material such as described in U.S. patent application Ser. Nos. 13/155,719 and 13/158,797, the disclosures of which are hereby incorporated herein by reference. In a particular embodiment, the joints can have a similar structure or be formed in a manner as described therein.

The contacts 70 can be exposed at the first surface 41 of the substrate element 40, the contacts being electrically connected with the first conductive vias 44. The contacts 70 can be joined to element contacts 35 of at least one of the microelectronic elements 30 by conductive joining units 71.

The conductive joining units 71 can be similar in structure and function to the joining units 11 described above.

In a particular example, the contacts 70 can have a finer minimum pitch than the terminals 80, i.e., the minimum distance D 1 between centers of adjacent ones of the contacts can be less than the minimum distance D 2 between centers of adjacent ones of the terminals. In one embodiment, the minimum pitch of the contacts 70 can be at least five times less than the minimum pitch of the terminals 80.

The microelectronic assembly 10 can also include an encapsulant 90 that can optionally cover, partially cover, or leave uncovered the rear surfaces 32 of the microelectronic elements 30. For example, in the microelectronic assembly 10 shown in FIG. 1A, an encapsulant can be flowed, stenciled, screened or dispensed onto the rear surfaces 32 of the microelectronic elements 30. In another example, the encapsulant 90 can be a mold compound which is formed thereon by overmolding. In some embodiments, portions of the encapsulant 90 can be removed, such that the encapsulant does not have a planar exposed surface 91. In one example, the encapsulant 90 can have a greater thickness between some microelectronic elements 30 and the exposed surface 91 than between other microelectronic elements and the exposed surface.

The circuit panel 12 can have first and second opposing surfaces 13 and 14 and pluralities of electrically conductive panel contacts 15 exposed at the first surface. The interconnection element 20 can be mounted to the panel contacts 15, for example, by the joining units 11 that can extend between the terminals 80 and the panel contacts. As shown in FIG. 1A, the second surface 22 of the interconnection element 20 can confront the first surface 13 of the circuit panel 12.

The circuit panel 12 can include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate of the circuit panel 12 can consist essentially of a material having a CTE of less than 30 ppm/° C. in the plane of the substrate, i.e., in a direction along its surface.

A method of fabricating the microelectronic assembly 10 (FIGS. 1A and 1B) will now be described, with reference to the FIGS. 2A through 2I. As illustrated in FIG. 2A, the openings 43 can be formed extending through the thickness of the body 40 a of the substrate element 40 from the first surface 41 towards the second surface 42. The openings 43 can be formed for example, by selectively etching the substrate element 40, after forming a mask layer where it is desired to preserve remaining portions of the first surface 41. For example, a photoimageable layer, e.g., a photoresist layer, can be deposited and patterned to cover only portions of the first surface 41, after which a timed etch process can be conducted to form the openings 43.

The inner surfaces 45 of the openings 43 may extend in a vertical or substantially vertical direction downwardly from the first surface 41 towards the second surface 42 substantially at right angles to the exposed surface, as shown in FIG. 2A. Anisotropic etching processes, laser ablation, mechanical removal processes, e.g., milling, ultrasonic machining, directing a jet of fine abrasive particles towards the substrate element 40, reactive ion etching, or plasma etching, or combinations of multiple processes mentioned above, among others, can be used to form openings 43 having essentially vertical inner surfaces.

Alternatively, instead of being substantially at right angles to the exposed surface, the inner surfaces 45 of the openings 43 may be sloped, i.e., may extend at angles other a normal angle (right angle) to the exposed surface. Wet etching processes, e.g., isotropic etching processes and sawing using a tapered blade, among others, can be used to form openings 43 having sloped inner surfaces 45. Laser ablation, mechanical milling, chemical etching, plasma etching, directing a jet of fine abrasive particles towards the substrate element 40, among others, can also be used to form the openings 43 (or any other hole or opening described herein) having sloped inner surfaces 45.

In some examples, at least a portion of the inner surfaces 45 of one or more of the openings 43 can have a cross-sectional shape that is an elliptic paraboloid, a hyperboloid, or a curvilinear shape, among others. As used herein, when a surface is described as having curvilinear cross-sectional shape, a cross-section of that surface in a plane that is generally perpendicular to the first and second surfaces of the substrate element is a curve having a varying slope (e.g., a second order polynomial).

Thereafter, an insulating dielectric layer (not visible in FIG. 2A) can be formed on the inner surface 45 of each opening 43. Various methods can be used to form such an insulating dielectric layer overlying the inner surfaces 45 of the openings 43, and such methods are described below. In particular examples, chemical vapor deposition (CVD) or atomic layer deposition (ALD) can be used to deposit a thin insulating dielectric layer overlying the inner surfaces 45 of the openings 43. In one example, tetraethylorthosilicate (TEOS) can be used during a low-temperature process for depositing such an insulating dielectric layer. In exemplary embodiments, a layer of silicon dioxide, borophosphosilicate glass (BPSG), borosilicate glass (BSG), or phosphosilicate glass (PSG) can be deposited overlying the inner surfaces 45 of the openings 43, and such glass can be doped or undoped.

In one example, a flowable dielectric material can be applied to the first surface 41 of the substrate element 40, and the flowable material can then more evenly distributed across the exposed surface during a "spin-coating" operation, followed by a drying cycle which may include heating. In another example, a thermoplastic film of dielectric material can be applied to the first surface 41 after which the assembly is heated, or is heated in a vacuum environment, i.e., placed in an environment under lower than ambient pressure. In another example, vapor deposition can be used to form the insulating dielectric layer.

In still another example, the assembly including the substrate element 40 can be immersed in a dielectric deposition bath to form a conformal dielectric coating or insulating dielectric layer. As used herein, a "conformal coating" is a coating of a particular material that conforms to a contour of the surface being coated, such as when the insulting dielectric layer conforms to a contour of the inner surface 45 of the openings 43. An electrochemical deposition method can be used to form the conformal dielectric layer, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer on exposed surfaces of the substrate element 40 that are conductive or semiconductive, including but not limited to along the inner surface 45 of the openings 43. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on a remaining passivation layer overlying the first surface 41 of the substrate element 40, due to its dielectric (nonconductive) property. Stated another way, a property of electrophoretic deposition is that it does not normally form on a layer of dielectric material, and it does not form on a dielectric layer overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |

TABLE 1-continued

| | | | |
|---|---|---|---|
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |
| ECOAT NAME | ELECTROLAC | LECTRASEAL DV494 | LECTROBASE 101 |
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

Figure 2A:
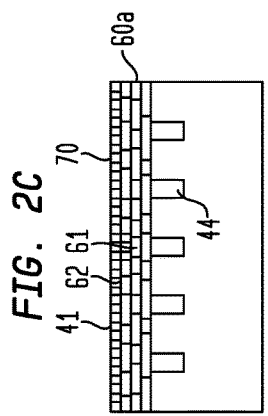
FIGS. 2A-2I are side sectional views illustrating stages of fabrication in accordance with the embodiment depicted in FIGS. 1A and 1B.
Figure 2B:
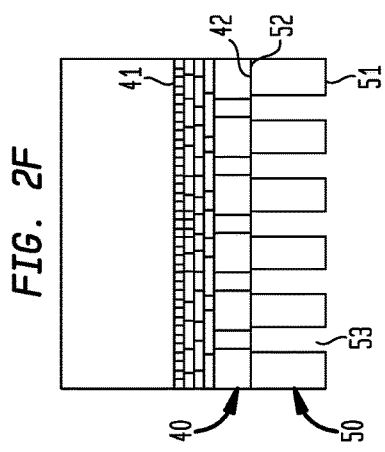

Thereafter, as illustrated in FIG. 2B, the first conductive vias 44 can be formed overlying the insulating dielectric layer, at least within the openings 43, such that a contour of each first conductive via conforms to contours of the corresponding inner surfaces 45.

To form the first conductive vias 44 (and any of the other conductive elements described herein), an exemplary method involves depositing a metal layer by one or more of sputtering a primary metal layer onto exposed surfaces of the substrate element 40 and the openings 43, plating, or mechanical deposition. Mechanical deposition can involve the directing a stream of heated metal particles at high speed onto the surface to be coated. This step can be performed by blanket deposition onto the first surface 41 and the inner surfaces 45, for example. In other embodiments, sub-micron metal powder can be screened or selectively screened into the openings 43, for example, using a pulse laser, and the metal flow will fill the cavities. This step can be performed by blanket deposition onto the dielectric layer within the openings 43.

In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the first conductive vias 44 (and any of the other conductive elements described herein). In particular examples, a stack including a plurality of metal layers can be formed on one or more of the afore-mentioned surfaces. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

Figure 2C:
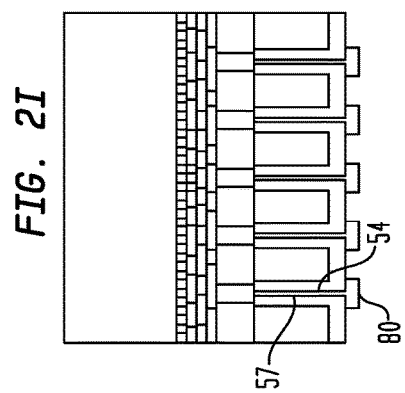

Thereafter, as shown in FIG. 2C, the conductor layer 60a can be formed at the first surface 41 of the substrate element 40, such that an exposed surface of the conductor layer becomes the first surface of the substrate element. The conductor layer 60a can include a plurality of layers of conductive traces 61 that are separated and insulated from one another by dielectric material 62. The contacts 70 can be formed at an exposed surface of the conductor layer 60a, and such contacts can be electrically connected with the conductive vias 44 through the traces 61 of the conductor layer. The traces 61 and the contacts 70 can be formed using similar methods as described above with reference to the first conductive vias 44, and the dielectric material 62 can be formed using similar methods as described above with reference to the dielectric layer 45 (FIG. 2B).

Figure 2D:
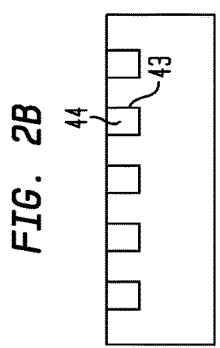
Figure 2E:
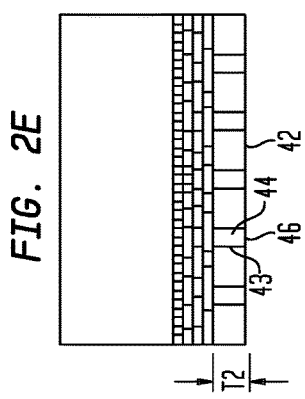

Next, as shown in FIG. 2D, a support substrate 5 can be removably attached to the conductor layer 60a to hold and support the semiconductor layer 40 during subsequent processing at the second surface 42 of the semiconductor layer. Then, as shown in FIG. 2E, the semiconductor layer 40 can be thinned by removing material of the body 40a at the second surface 42, reducing the thickness of the semiconductor layer from an initial thickness T1 (FIG. 2D) to a final thickness T2 (FIG. 2E), such that ends 46 of the first conductive vias 44 are exposed at the second surface 42 of the semiconductor layer. The semiconductor layer 40 can be thinned, for example, by a grinding or lapping process. The initial exposed second surface 42 can also be planarized by lapping, polishing, or by high-precision milling.

Figure 2F:
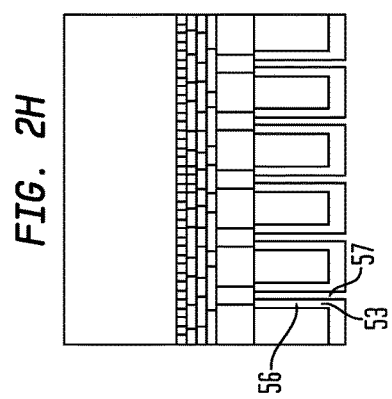

Subsequently, a second conductor layer 60b (FIG. 1A) can be formed at the second surface 42 of the semiconductor layer 40. Such a second conductor layer 60b, if present, can be formed in a similar manner as that described with reference to the first conductor layer 60a (FIG. 2C). Next, as shown in FIG. 2F, the support element 50 can be united with the semiconductor layer 40, for example, using an adhesive layer or a B-stage material layer. The openings 53 can be formed extending through the thickness of the body 50a of the support element 50 between the first and second surfaces 51, 52 thereof. The openings 53 can be formed for example, by selectively etching the support element 50, after forming a mask layer where it is desired to preserve remaining portions of the first surface 51. For example, a photoimageable layer, e.g., a photoresist layer, can be deposited and patterned to cover only portions of the first surface 51, after which a timed etch process can be conducted to form the openings 53. The openings 53 can be formed using one or more of the processes described above for forming the openings 43. The openings 53 can be formed before or after the support element 50 is united with the substrate element 40.

Figure 2G:
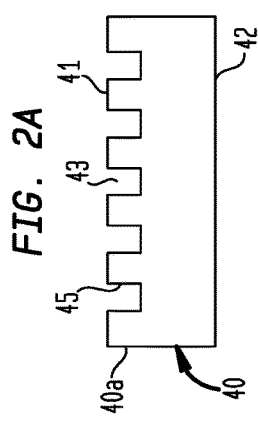

Then, as shown in FIG. 2G, the dielectric material 56 can be formed extending within the openings 56, and the dielectric layer 23 can be formed overlying the first surface 51 of the support element 50. The dielectric material 56 and the dielectric layer 23 can be formed as a single dielectric region in a single deposition process, or they can be formed as individual dielectric regions in separate deposition processes.

Figure 2H:
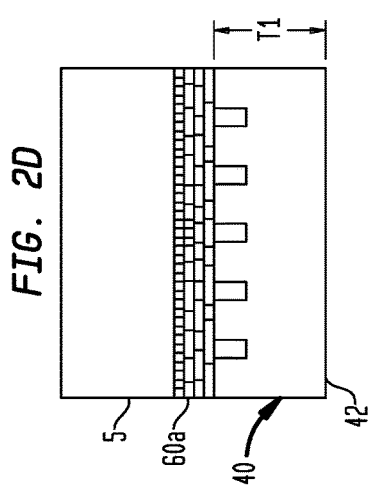
Figure 2I:
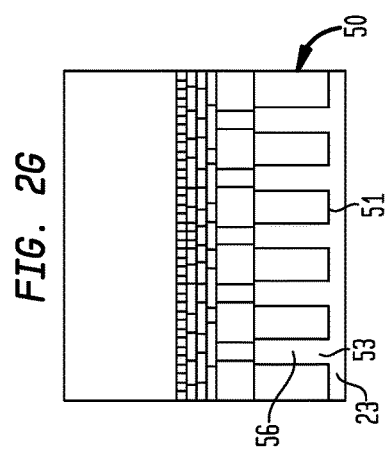

Next, as shown in FIG. 2H, a recess 57 can be formed within the dielectric material 56 in at least some of the openings 53 where it is desired to deposit second conductive vias 54. The recesses 57 can be formed by any of the processes described above with reference to forming the openings 43. Subsequently, referring to FIG. 2I, the second conductive vias 54 can be formed within corresponding ones of the recesses 57, and the terminals 80 can be formed in contact with corresponding ones of the second conductive vias.

Next, referring again to FIG. 1A, the microelectronic elements 30 can be assembled with the interconnection element 20, such that the element contacts 35 thereof are electrically connected with the contacts 70, and the interconnection element can be assembled with the circuit panel 12, such that the terminals 80 are electrically connected with the panel contacts 15. Then, the encapsulant 90 can be deposited to at least partially cover the microelectronic elements 30.

Figure 1B:
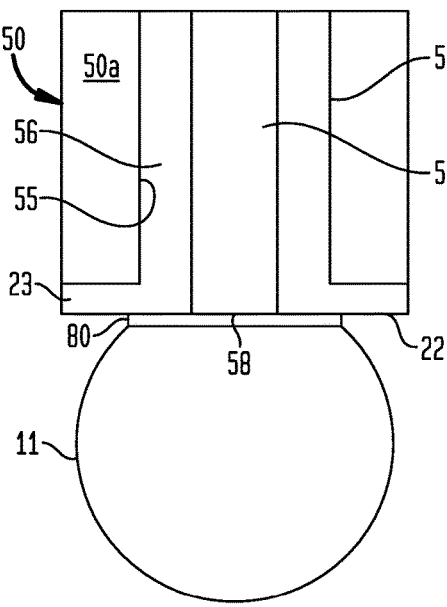
FIG. 1B is an enlarged side sectional view of a portion of FIG. 1A.
Figure 1C:
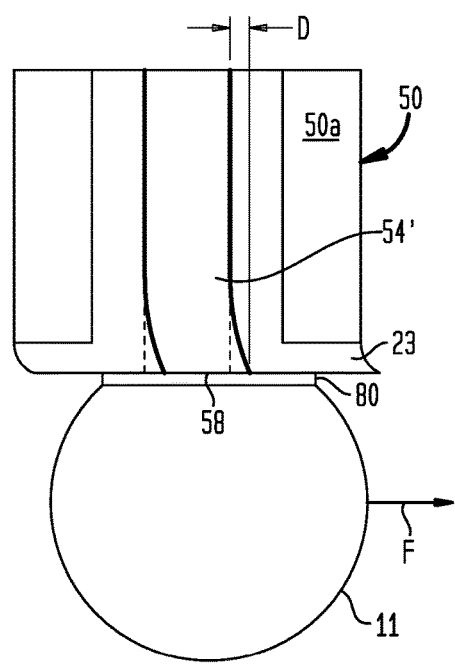
FIG. 1C is an enlarged side sectional view of a portion of FIG. 1A experiencing movement due to differential thermal expansion.
Figure 3A:
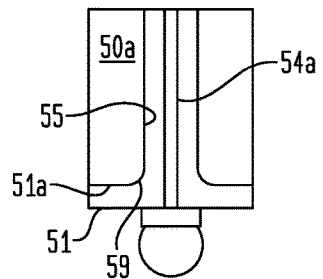
FIGS. 3A-3I are enlarged side sectional views illustrating alternative embodiments of the second conductive vias shown in FIGS. 1A and 1B.

FIGS. 3A through 3I illustrate variations of the second conductive vias 54 of FIGS. 1A and 1B having alternate configurations. The conductive via 54 a shown in FIG. 3A is the same as the conductive via 54 described above, except that the opening 53a has rounded corners 59 extending between the first surface 51a of the body 50a of the support element 50 and the inner surfaces 55 of the opening. Such rounded corners 59 can reduce resulting stress on the support element 50 at the first surface 51 thereof due to differential thermal expansion between the interconnection element 20 and an external component such as the circuit panel 12. The rounded corners 59 between the first surface 51a of the body 50a of the support element 50 and the inner surfaces 55 of the opening 53a can be formed, for example, by high pressure plasma processing, a less anisotropic etching process than a conventional etching process, or a wet or dry etching process. In a particular example, the rounded corner 59 can have a radius of curvature approximately equal to a radius of the opening 53a in a plane parallel to the first surface 51a of the body 50a.

Figure 3B:
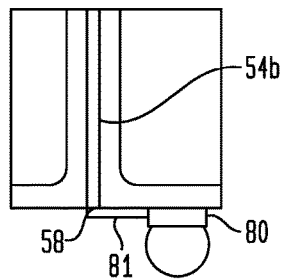

The conductive via 54b shown in FIG. 3B is the same as the conductive via 54a described above, except that the terminal 80 is displaced along the lateral direction L1 with respect to the end 58 of the conductive via 54b. A conductive trace can electrically connect the end 58 of the conductive via 54b with the corresponding terminal 80.

Figure 3C:
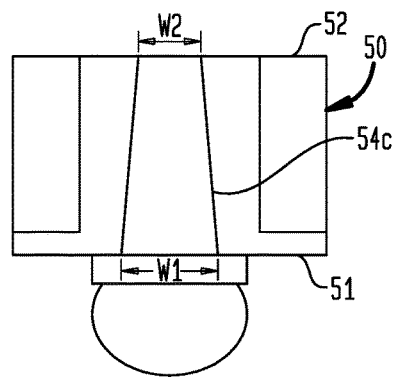

The conductive via 54c shown in FIG. 3C is the same as the conductive via 54 described above, except that the conductive via 54c has a width that tapers from the first surface 51 of the support element 50 towards the second surface 52, such that the width W1 at the first surface is greater than the width W2 at the second surface 52. In one example, the conductive via 54c can have a frusto-conical shape.

Figure 3D:
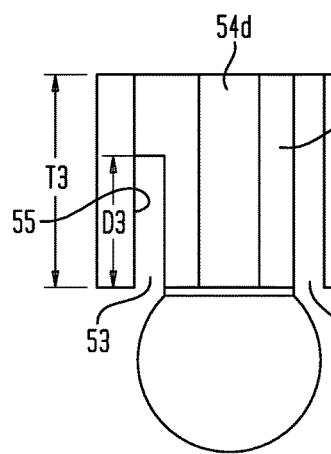

The conductive via 54d shown in FIG. 3D is the same as the conductive via 54 described above, except that there is a gap 82 extending between the dielectric region 56d and the inner surfaces 55 of the corresponding opening 53. In a particular example, as can be seen in FIG. 3D, the gap 82 need not extend the entire thickness T3 of the support element 50. For example, the gap 82 may extend a distance D3 from the first surface 51 of the support element 50 towards the second surface 52, and a portion of the dielectric region 56d may extend between the inner surface 55 and the conductive via 54 d below the distance D3.

In an exemplary embodiment, the gap 82 may extend most of the distance between the first and second surfaces 51 and 52 of the support element 50, except that the gap may be plugged or sealed adjacent the first surface, for example, by the insertion of a compliant sealant between the dielectric region 56d and the inner surfaces 55 of the opening 53. In such an embodiment, the gap 82 can be sealed at both ends, thereby trapping air within the gap. In one example, such a complaint plug may extend up to 25% of the thickness T3 from the first surface 51 towards the second surface 52 of the support element 50.

Figure 3E:
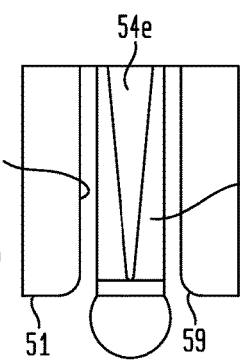

The conductive via 54e shown in FIG. 3E is a variation of the conductive via 54d, where the conductive via 54e has a tapered width, and the opening 54 has rounded corners 59 extending between the inner surfaces 55 of the opening 53 and the first surface 51 of the support element 50.

Figure 3F:
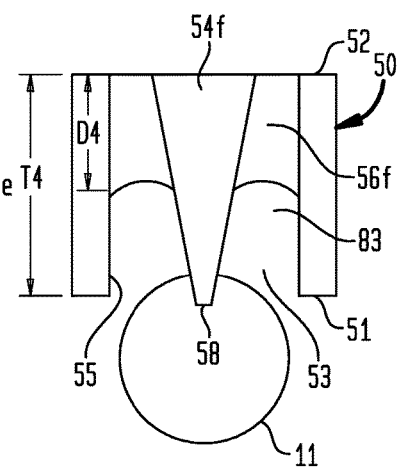

The conductive via 54f shown in FIG. 3F is similar to the conductive via 54 described above, except that the dielectric region 56f does not extend to the first surface 51 of the support element 50, such that there is a gap 83 between portions of the conductive via 54f and the inner surfaces 55 of the opening 53. Also, the terminal 80 is omitted, and the joining unit 11 is bonded to the tip 58 of the conductive via 54f adjacent the first surface 51 of the support element 50, and the conductive via 54f has a width that tapers from the second surface 52 of the support element towards the first surface, such that the width is greater at the second surface than at the first surface.

In one example, the dielectric region 56f can extend from the second surface 52 to a distance D4 of approximately 50% of the thickness T4 of the support element 50. In a particular embodiment, the dielectric region 56f can extend from the second surface 52 to a distance D4 of between approximately 25% and approximately 75% of the thickness T4 of the support element 50.

Figure 3G:
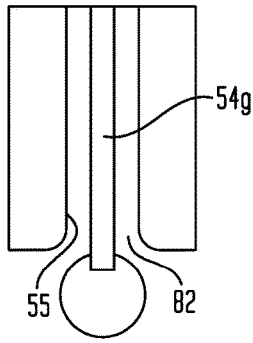

The conductive via 54g shown in FIG. 3G is the same as the conductive via 54a described above, except that the dielectric region 56 is omitted, and the conductive via 54g is a thin wire, rather than a conductive post. A gap 82 can extend between outer surfaces of the conductive via 54g and the inner surfaces 55 of the opening 53.

Figure 3H:
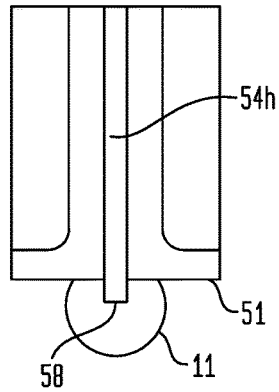
Figure 3I:
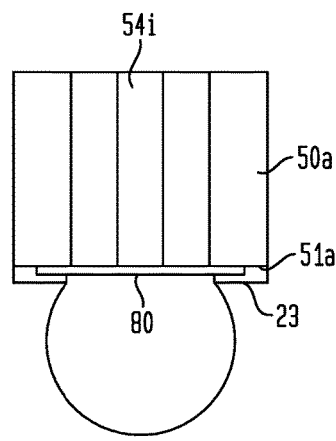

The conductive via 54h shown in FIG. 3H is the same as the conductive via 54a described above, except that the terminal 80 is omitted. The tip 58 of the conductive via 54h extends above the first surface 51 of the support element 50, so that the joining unit 11 has a sufficient surface with which to bond. The conductive via 54 i shown in FIG. 3I is the same as the conductive via 54 described above, except that the terminal 80 is disposed against the exposed surface 51a of the body 50a of the support element 50, rather than overlying the dielectric layer 23.

Figure 4:
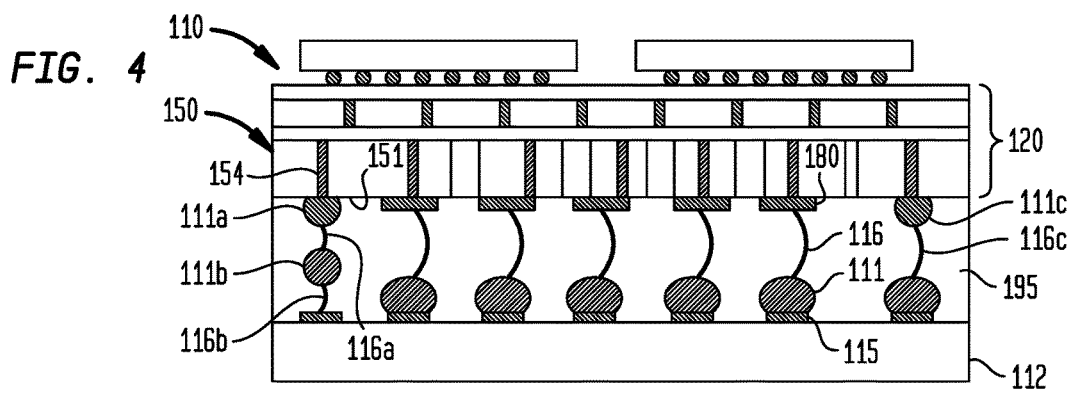
FIG. 4 is a side sectional view illustrating a microelectronic assembly in accordance with another embodiment of the invention.
Figure 5:
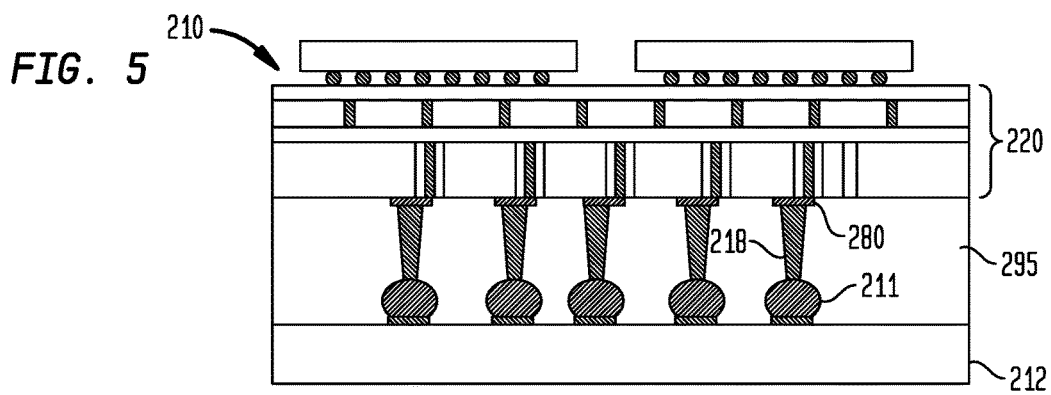
FIG. 5 is a side sectional view illustrating a microelectronic assembly in accordance with yet another embodiment of the invention.

The microelectronic assembly 110 shown in FIG. 4 is the same as the microelectronic assembly 10 described above, except that wire bonds 116 extend between the terminals 180 and the joining units 111, thereby providing an ability of the interconnection element 120 to move relative to the circuit panel 112 due to differential thermal expansion. An encapsulant 195 can be provided to at least partially cover the wire bonds 116.

In a particular example, as shown at the left side of FIG. 4, at least some of the terminals 180 can be omitted, and a joining unit 111a can be electrically connected with an exposed end of the conductive via 154 at the first surface 151 of the support element 150. In one example, a first wire bond 116a can extend between the joining unit 111a and an intermediate joining unit 111b, and a second wire bond 116b can extend between the intermediate joining unit 111b and the panel contact 115 of the circuit panel 112. In an exemplary embodiment (not shown), a single wire bond may extend directly from the joining unit 111a to the panel contact 115, and the intermediate joining unit 111b can be omitted. In one example, a single wire bond 116c can extend between a first joining unit 111c adjacent the first surface 151 of the support element 150 and a second joining unit 111 electrically connected with the panel contact 115 of the circuit panel 112.

The microelectronic assembly 210 shown in FIGS is the same as the microelectronic assembly 10 described above, except that tapered conductive posts 218 extend between the terminals 280 and the joining units 211, thereby providing an ability of the interconnection element 220 to move relative to the circuit panel 212 due to differential thermal expansion. An encapsulant 295 can be provided to at least partially cover the tapered conductive posts 218.

Figure 6:
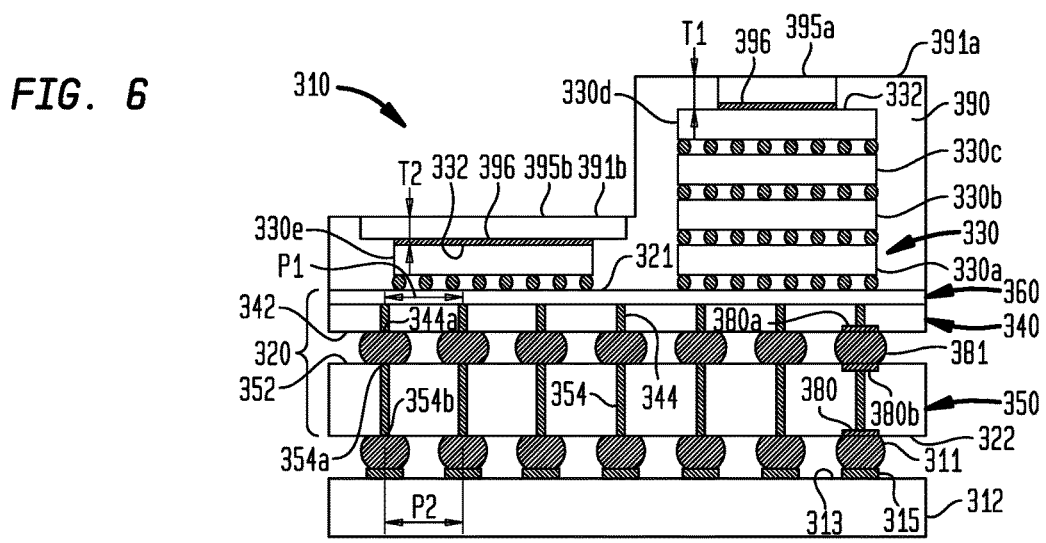
FIG. 6 is a side sectional view illustrating a microelectronic assembly in accordance with still another embodiment of the invention.

The microelectronic assembly 310 shown in FIG. 6 is the same as the microelectronic assembly 10 described above, except that the plurality of first conductive vias 344 can have a minimum pitch P1 between longitudinal axes of any two adjacent ones of the first conductive vias that is substantially equal to a minimum pitch P2 between longitudinal axes of any two adjacent ones of the plurality of second conductive vias 354. As used herein, minimum pitch between conductive vias means the distance in a direction parallel to the first surface 321 of the interconnection element 320 between longitudinal axes extending through the centerlines of any two adjacent ones of the conductive vias.

In a particular embodiment, the minimum pitch P1 between the first conductive vias 344 can be less than the minimum pitch P2 between the second conductive vias 354. In one example, the minimum pitch P1 between the first conductive vias 344 can be greater than the minimum pitch P2 between the second conductive vias 354. In an exemplary embodiment, the plurality of first conductive vias 344 can contain an equal or greater number of conductive vias than the plurality of second conductive vias 354. In one embodiment, the plurality of first conductive vias 344 can contain a lower number of conductive vias than the plurality of second conductive vias 354.

Also, the microelectronic assembly 310 can have a plurality of first conductive joining units 381 that can extend between exposed ends 344a of at least some of the first conductive vias 344 and exposed ends 354a of corresponding ones of the second conductive vias 354. The first conductive joining units 381 need not directly connect the exposed ends 344a of the first conductive vias 344 with the exposed ends 354a of corresponding ones of the second conductive vias 354.

For example, as shown at the right side of FIG. 6, the first conductive joining units 381 can extend between a conductive pad 380a exposed at the second surface 342 of the substrate element 340 and a conductive pad 380b exposed at the second surface 352 of the support element 350. Furthermore, the conductive pads 380a and 380b need not directly contact the respective first and second conductive vias 344 and 354. Rather, one or more of the conductive pads 380a and 380b can be spaced apart from the exposed ends of the respective first and second conductive vias 344 and 354 and can be electrically connected therewith via one or more conductor layers similar to the conductor layer 360.

The microelectronic assembly 310 can also have a plurality of second conductive joining units 311 that can extend between exposed ends 354b of at least some of the second conductive vias 354 corresponding ones of the panel contacts 315. The second conductive joining units 311 need not directly connect the exposed ends 354b of the second conductive vias 354 with the panel contacts 315. Rather, as shown at the right side of FIG. 6, the second conductive joining units 311 can extend between a conductive pad 380 exposed at the second surface 322 of the interconnection element 320 and a panel contact 315 exposed at a surface 313 of the circuit panel 312. Furthermore, one or more of the conductive pads 380 can be spaced apart from the exposed end of a corresponding second conductive via 354 and can be electrically connected therewith via one or more conductor layers similar to the conductor layer 360.

In one example, the first plurality of joining units 381 can contain an equal or greater number of joining units than the second plurality of joining units 311. In a particular embodiment, the first plurality of joining units 381 contains a fewer number of joining units than the second plurality of joining units 311.

In embodiments where the minimum pitch P1 between adjacent ones of the first conductive vias 344 is close to the minimum pitch P2 between adjacent ones of the second conductive vias 354, the difference between the minimum pitch P1 and the minimum pitch P2 can be approximately 10% of the average diameter of the joining units 381. For example, if the average joining unit 381 has a diameter that is 50 microns, then the difference between the minimum pitch P1 and the minimum pitch P2 can be 5 microns. In such an embodiment, the joining unit 381 can accommodate such a lateral mismatch in alignment between corresponding ones of the first and second conductive vias 344 and 354.

Similar to the microelectronic assembly 10 shown in FIG. 1A, the microelectronic assembly 310 can also include an encapsulant 390 that can optionally cover, partially cover, or leave uncovered the rear surfaces 332 of the microelectronic elements 330. For example, in the microelectronic assembly 310 shown in FIG. 6, an encapsulant can be flowed, stenciled, screened or dispensed onto the rear surfaces 332 of the microelectronic elements 330.

In one example, the encapsulant 390 can be a topographical overmold that has first and second surface portions 391a, 391b that can conform to the contour of the rear surfaces 332 of the microelectronic elements 330. For example, the first surface portion 391a of the encapsulant 390 can be parallel to the rear surface 332 of the microelectronic element 330d (e.g., the top microelectronic element of a stack of microelectronic elements that can be configured to predominantly provide memory storage array function), and the second surface portion 391b can be parallel to the rear surface of the microelectronic element 330e (e.g., a microelectronic element that can be configured to predominantly provide logic function), the first surface portion extending in a different plane than the second surface portion.

In such an example, the first surface portion 391a of the encapsulant 390 can be located a first distance T1 from the rear surface 332 of the microelectronic element 330d, and the second surface portion 391b of the encapsulant can be located a second distance T2 from the rear surface of the microelectronic element 330e, where the distances T1 and T2 are equal or substantially equal. However, the first and second surface portions 391a, 391b can be located different distances from the first surface 321 of the interconnection element 320.

In a particular embodiment, the microelectronic assembly 310 can include an encapsulant or underfill (not shown) that can extend between the second surface 342 of the substrate element 340 and the second surface 352 of the support element 350, surrounding the first joining units 381, for example, to provide mechanical support to the substrate element and/or to minimize warpage of the substrate element. In one example, a similar encapsulant or underfill (not shown) can extend between the second surface 322 of the interconnection substrate 320 and the surface 313 of the circuit panel 312, surrounding the second conductive joining units 311. Also, an encapsulant or underfill can separate and insulate the first conductive joining units 381 from one another. In one example, a dielectric material can be deposited onto exposed surfaces of the first joining units 381, using a vapor deposition process, and an encapsulant or overmold can then optionally be applied extending between the first joining units.

In a particular embodiment, the microelectronic assembly 310 can also include one or more heat spreaders 395a, 395b in thermal communication with one or more of the microelectronic elements 30. The heat spreaders 395a and 395b may be separate elements, or they may be different portions of a single heat spreader. One or more of the heat spreaders 395a and 395b can be coupled to an exposed surface (e.g., the rear surface 332) of the microelectronic elements 330 by a layer of thermal grease or a thermal adhesive 396, for example.

In one example, at least a portion of the heat spreader 395b overlying a microelectronic element 30e that may be configured to predominantly provide logic function can have a thickness T2 that is equal or substantially equal to a thickness T1 of at least a portion of the heat spreader 395a overlying a microelectronic element 30d that may be configured to predominantly provide memory storage array function. In a particular example, at least a portion of the heat spreader 395b overlying a microelectronic element 30e that may be configured to predominantly provide logic function can have a greater thickness than at least a portion of the heat spreader 395a overlying a microelectronic element 30 d that may be configured to predominantly provide memory storage array function.

Figure 7:
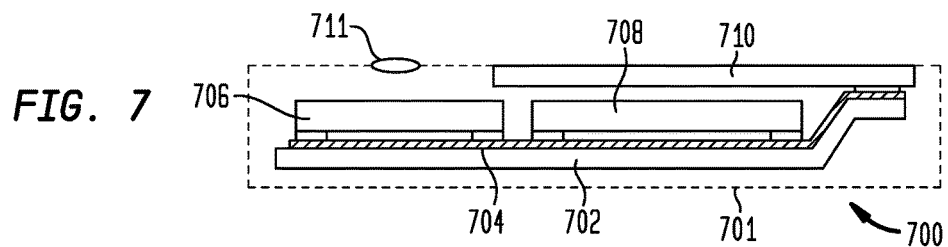
FIG. 7 is a schematic depiction of a system according to one embodiment of the invention.

The components described above can be utilized in construction of diverse electronic systems, as shown in FIG. 7. For example, a system 700 in accordance with a further embodiment of the invention includes a microelectronic assembly 706 as described above in conjunction with other electronic components 708 and 710. In the example depicted, component 708 is a semiconductor chip whereas component 710 is a display screen, but any other components can be used. Of course, although only two additional components are depicted in FIG. 7 for clarity of illustration, the system may include any number of such components. The microelectronic assembly 706 may be any of the components described above. In a further variant, any number of such microelectronic assemblies 706 can be used.

The microelectronic assembly 706 and components 708 and 710 can be mounted in a common housing 701, schematically depicted in broken lines, and can be electrically interconnected with one another as necessary to form the desired circuit. In the exemplary system shown, the system can include a circuit panel 702 such as a flexible printed circuit board, and the circuit panel can include numerous conductors 704, of which only one is depicted in FIG. 7, interconnecting the components with one another. However, this is merely exemplary; any suitable structure for making electrical connections can be used.

The housing 701 is depicted as a portable housing of the type usable, for example, in a cellular telephone or personal digital assistant, and screen 710 can be exposed at the surface of the housing. Where structure 706 includes a light-sensitive element such as an imaging chip, a lens 711 or other optical device also can be provided for routing light to the structure. Again, the simplified system shown in FIG. 7 is merely exemplary; other systems, including systems commonly regarded as fixed structures, such as desktop computers, routers and the like can be made using the structures discussed above.

Although a silicon substrate having active device regions therein is only described with reference to the embodiment shown in FIGS. 1A and 1B, the substrate element of any of the components described herein can be made of silicon or a dielectric material such as glass, a low-k material (i.e., a material having a k less than 3.5), ceramic, a composite material, or symmetric or asymmetric laminates, as described above. When the substrate element is made of silicon, any such substrate element in any of the embodiments described herein can include active semiconductor devices in one or more active device regions of the substrate element.

The openings, apertures, and conductive elements disclosed herein can be formed by processes such as those disclosed in greater detail in United States Patent Application Publication Nos. 2008/0246136, 2012/0018863, 2012/0018868, 2012/0018893, 2012/0018894, 2012/0018895, and 2012/0020026, the disclosures of which are hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of fabricating a microelectronic assembly, comprising:
    uniting exposed surfaces of at least one of dielectric or semiconductor material of a substrate element and a support element with one another, the uniting including forming a bond between the exposed surfaces of the substrate element and the support element using one or more layers of dielectric material;
        the substrate element having first and second opposite surfaces defining a thickness, and having a plurality of contacts exposed at the first surface and electrically conductive structure extending through the thickness, the exposed surface of the at least one of dielectric or semiconductor material of the substrate element being the second surface thereof, and
        the support element having a body having first and second opposite surfaces, and having electrically conductive vias extending between the first and second surfaces of the support element through a thickness of the body, the exposed surface of the at least one of dielectric or semiconductor material of the support element being the second surface thereof; and
    after uniting the exposed surfaces of the substrate element and the support element, applying heat to the one or more layers of dielectric material, wherein the one or more layers of dielectric material includes conductors providing direct electrical connection between the conductive vias and the electrically conductive structure, wherein the conductors include conductive traces that are separated and insulated from one another by the one or more layers of dielectric material.

2. The method as claimed in claim 1, wherein the one or more layers of dielectric material include an adhesive layer or a B-stage material layer.

3. The method as claimed in claim 1, wherein the substrate element includes a semiconductor body, and one or more semiconductor devices are disposed in one or more active device regions of the semiconductor body located at or below the first surface of the substrate element.

4. The method as claimed in claim 1, wherein the support element has openings extending between the first and second surfaces of the support element through the thickness of the body, the method further comprising forming the electrically conductive vias extending within the openings.

5. The method as claimed in claim 4, wherein each of at least some of the electrically conductive vias is separated by a compliant dielectric material from an inner surface of the opening in which it extends.

6. The method as claimed in claim 4, wherein the electrically conductive structure extending through the substrate element thickness includes a plurality of electrically conductive vias, and wherein a minimum pitch between any two adjacent ones of the conductive vias of the substrate element is less than or equal to a minimum pitch between any two adjacent ones of the electrically conductive vias extending through the openings of the support element.

7. The method as claimed in claim 4, further comprising forming a compliant dielectric material extending within the openings, wherein the electrically conductive vias are formed extending within an aperture extending through the compliant dielectric material.

8. The method as claimed in claim 4, further comprising forming terminals exposed at the first surface of the support element, the terminals being electrically connected with the contacts through the electrically conductive vias and the electrically conductive structure.

9. The method as claimed in claim 8, wherein the steps of forming the conductive vias and the terminals forms at least some of the terminals integrally with the electrically conductive vias as ends of the electrically conductive vias.

10. The method as claimed in claim 8, further comprising forming a compliant dielectric layer extending along the first surface of the support element.

11. The method as claimed in claim 10, wherein at least some of the terminals at least partially overlie the compliant dielectric layer.

12. The method as claimed in claim 1, wherein at least some of the electrically conductive vias are wire bonds.

13. The method as claimed in claim 1, wherein the thickness of the substrate element between the first and second surfaces thereof is 200 microns or less.

14. The method as claimed in claim 1, wherein the thickness of the substrate element is less than the thickness of the support element.

15. The method as claimed in claim 1, wherein the thickness of the substrate element is less than one-fifth the thickness of the support element.

16. The method as claimed in claim 1, wherein the thickness of the support element is at least 1.5 times the thickness of the substrate element, and wherein the Young's modulus of the support element is greater than 60 GPa.

17. The method as claimed in claim 1, wherein the thickness of the support element is at least 1.5 times the thickness of the substrate element, and wherein the Young's modulus of the support element is at least 1.3 times the Young's modulus of the substrate.

18. The method as claimed in claim 1, wherein the body of the support element has a CTE of less than 12 ppm/° C.

19. The method as claimed in claim 1, further comprising assembling a microelectronic element with the substrate element, the microelectronic element having a surface bearing element contacts thereon, the assembling including electrically connecting at least some of the contacts of the substrate element with at least some of the element contacts.

20. The method as claimed in claim 8, further comprising assembling a circuit panel with the support element, at least some of the terminals exposed at the first surface of the support element being joined to and electrically connected with panel contacts exposed at a surface of the circuit panel.

* * * * *